United States Patent
Miyazaki et al.

(10) Patent No.: US 10,363,882 B2
(45) Date of Patent: Jul. 30, 2019

(54) MOUNTING STRUCTURE

(71) Applicant: DENSO CORPORATION, Kariya, Aichi-pref. (JP)

(72) Inventors: Takahiro Miyazaki, Kariya (JP); Kazuhisa Nakagawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/325,106

(22) PCT Filed: Sep. 4, 2015

(86) PCT No.: PCT/JP2015/004492
§ 371 (c)(1),
(2) Date: Jan. 10, 2017

(87) PCT Pub. No.: WO2016/038861
PCT Pub. Date: Mar. 17, 2016

(65) Prior Publication Data
US 2017/0182950 A1    Jun. 29, 2017

(30) Foreign Application Priority Data
Sep. 12, 2014 (JP) ................................. 2014-186142

(51) Int. Cl.
*B60R 11/00* (2006.01)
*B60R 21/0136* (2006.01)
(Continued)

(52) U.S. Cl.
CPC .......... *B60R 11/00* (2013.01); *B60R 21/0136* (2013.01); *H05K 7/12* (2013.01);
(Continued)

(58) Field of Classification Search
CPC ................. B60R 11/00; B60R 21/0136; B60R 2011/004; B60R 2011/0059;
(Continued)

(56) References Cited

U.S. PATENT DOCUMENTS 6,594,870 B1 * 7/2003 Lambrecht ............ F16B 5/0628
24/297
7,019,215 B2 * 3/2006 Arai ...................... F16B 21/086
174/135

(Continued)

FOREIGN PATENT DOCUMENTS

JP     H05-302610 A    11/1993

*Primary Examiner* — Christopher Garft
(74) *Attorney, Agent, or Firm* — Posz Law Group, PLC

(57) ABSTRACT

A temporary fixing unit includes a supporting portion including a distal end portion passed through an aperture, and a holding portion provided with an inclined surface that slides along an edge portion of the aperture when passed through the aperture. The temporary fixing unit also includes a spring portion connecting the distal end portion of the supporting portion and the holding portion and that deforms in a twisted manner as the holding portion is pushed down when the inclined surface of the holding portion slides along the edge portion of the aperture. When the holding portion is passed through the aperture, a portion of a door panel is held between the holding portion and an elastic portion. Furthermore, the elastic portion is elastically deformed so as to press the door panel.

16 Claims, 4 Drawing Sheets

(51) Int. Cl.
   *H05K 7/12*     (2006.01)
   *B60R 21/00*    (2006.01)
   *B60R 21/01*    (2006.01)
   *G01L 1/04*     (2006.01)

(52) U.S. Cl.
   CPC . *B60R 2011/004* (2013.01); *B60R 2011/0059* (2013.01); *B60R 2021/0006* (2013.01); *B60R 2021/01006* (2013.01); *B60R 2021/01027* (2013.01); *G01L 1/04* (2013.01)

(58) Field of Classification Search
   CPC .. B60R 2021/0006; B60R 2021/01006; H05K 7/12; F60R 2021/01027; G01L 1/04
   USPC .......................................... 248/231.9; 24/458
   See application file for complete search history.

(56) References Cited

U.S. PATENT DOCUMENTS

| | | | | |
|---|---|---|---|---|
| 7,866,612 | B2 * | 1/2011 | Doi ........................ | H02G 3/30 |
| | | | | 248/67.5 |
| 2005/0087656 | A1 * | 4/2005 | Yonezawa ............. | F16B 21/088 |
| | | | | 248/71 |
| 2012/0036707 | A1 | 2/2012 | Ludwig | |
| 2015/0258953 | A1 * | 9/2015 | Murray, Jr. ............. | B60R 21/01 |
| | | | | 73/493 |
| 2015/0322985 | A1 * | 11/2015 | Scroggie ............... | F16B 19/008 |
| | | | | 29/428 |

\* cited by examiner

MOUNTING

HOOKED

MOUNTING STRUCTURE

CROSS REFERENCE TO RELATED APPLICATIONS

This application is a U.S. national stage of International Patent Application No. PCT/JP2015/004492 filed on Sep. 4, 2015 and is based on Japanese Patent Application No. 2014-186142 filed on Sep. 12, 2014, the disclosures of which are incorporated herein by reference.

TECHNICAL FIELD

The present disclosure relates to a mounting structure formed temporarily fixable to a mounting target.

BACKGROUND ART

A mounting structure in the related art used to mount a component-member supporting body to a mounting wall is described in, for example, Patent Literature 1. More specifically, a construction of a component-member supporting body provided with a pin structure is described. The pin structure has a locking element protruding in an L-shape at a distal end. That is to say, the pin structure has so-called a cantilever spring construction.

According to the component-member supporting body as above, when the pin structure is put into a pass-through opening provided to the mounting wall, the pin structure undergoes deflection by sliding along an edge portion of the pass-through opening and the locking element passes through the pass-through opening due to tensile stress applied to the locking element. Consequently, the component-member supporting body is temporarily fixed to the mounting wall. The component-member supporting body set in a temporarily-fixed state is fixed to the mounting wall via a fixing member, such as screws.

PRIOR ART LITERATURES

Patent Literature

Patent Literature 1: JP2013-507778A

SUMMARY OF INVENTION

According to the technique in the related art as above, however, when the locking element is hooked into the pass-through opening, the pin structure does not undergo deflection whereas compression stress is generated in a connection portion of the locking element and the pin structure. The inventors conducted an assiduous study and discovered a problem that when the locking element is pushed further into the pass-through opening, the connection portion of the locking element and the pin structure may no longer withstand the compression stress and possibly break.

The inventors discovered another problem that while the component-member supporting body is in a temporarily-fixed state in which the locking element is inserted in the pass-through opening of the mounting wall, the component-member supporting body cannot help wobbling with respect to the mounting wall and it is therefore not easy to fix the component-member supporting body by using the fixing member.

The present disclosure has an object to provide a mounting structure provided with a construction making a mounting structure temporarily fixable while preventing wobbling with respect to a mounting target and capable of preventing breaking of a temporary fixing unit temporarily fixed to the mounting target.

According to an aspect of the present disclosure, the mounting structure formed temporarily fixable to a mounting target having an aperture opened so as to penetrate through the mounting target includes a main body portion having a side wall portion, an elastic portion provided to the side wall portion so as to be in contact with a periphery of the aperture, and a temporary fixing unit including a portion to be passed through the aperture and provided to the side wall portion to temporarily fix the main body portion to the mounting target by sandwiching a part of the mounting portion between the temporary fixing unit and the elastic portion while the portion of the temporary fixing unit is passed through the aperture.

The temporary fixing unit has a supporting portion provided to the side wall portion and including a distal end portion to be passed through the aperture, a holding portion located oppositely to the main body portion and provided with an inclined surface which slides along an edge portion of the aperture when the holding portion is passed through the aperture, and a spring portion connecting the distal end portion of the supporting portion and the holding portion and undergoing torsional deformation when the holding portion is pushed down while the inclined surface of the holding portion slides along the edge portion of the aperture.

The main body portion is temporarily fixed to the mounting target when, by passing the holding portion through the aperture, the part of the mounting target is sandwiched between the holding portion and the elastic portion and further the elastic portion is forced to undergo elastic deformation while pressing against the mounting target.

According to the configuration as above, the spring portion is positioned on an opposite side of the mounting target to the main body portion. Hence, even when the holding portion is hooked into the aperture, no stress is applied to the holding portion because the spring portion is twisted. Hence, breaking of the temporary fixing unit can be prevented.

Also, when a part of the mounting target is sandwiched between the holding portion and the elastic portion, adhesion of the elastic portion to the mounting target can be enhanced due to elastic deformation of the elastic portion. Hence, the main body portion can be temporarily fixed to the mounting target while preventing the main body portion from wobbling with respect to the mounting target.

DESCRIPTION OF EMBODIMENTS

Hereinafter, an embodiment of the present disclosure will be described with reference to the drawings. A mounting structure of the present embodiment is formed as a lateral-collision detecting pressure sensor which detects a collision of another vehicle or the like to a door of an own vehicle. A detection result of the pressure sensor is used to actuate an occupant protecting device, such as air-bags.

Figure 1:
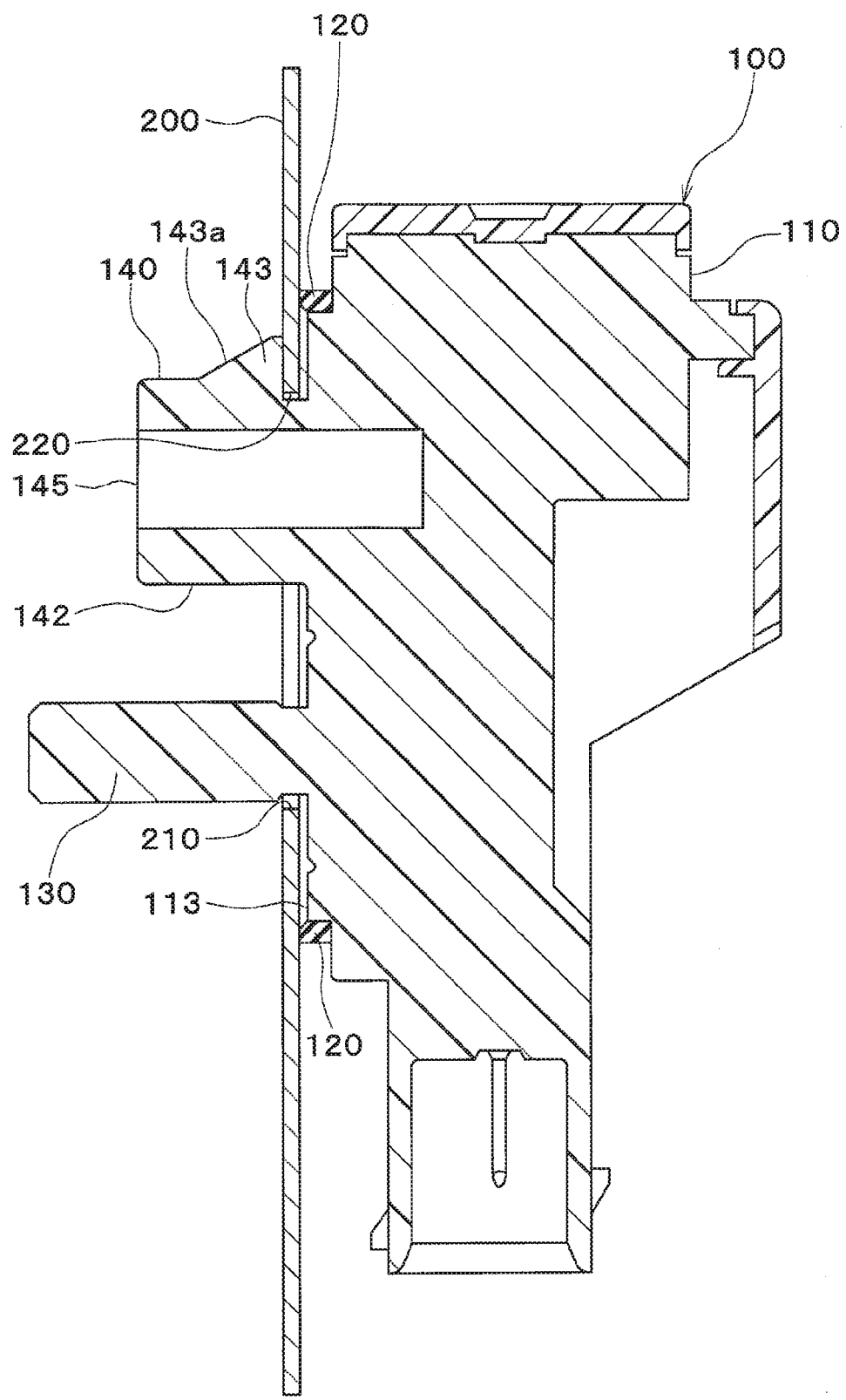
FIG. 1 is a sectional view of a pressure sensor according to an embodiment of the present disclosure.

As is shown in FIG. 1, a pressure sensor 100 is fixed to a door panel 200 that is plate-like and stored in a vehicle door. In order to fix the pressure sensor 100 to the door panel 200, the pressure sensor 100 is formed temporarily fixable to the door panel 200 through an aperture 210 opened so as to penetrate through a part of the door panel 200.

Figure 2:
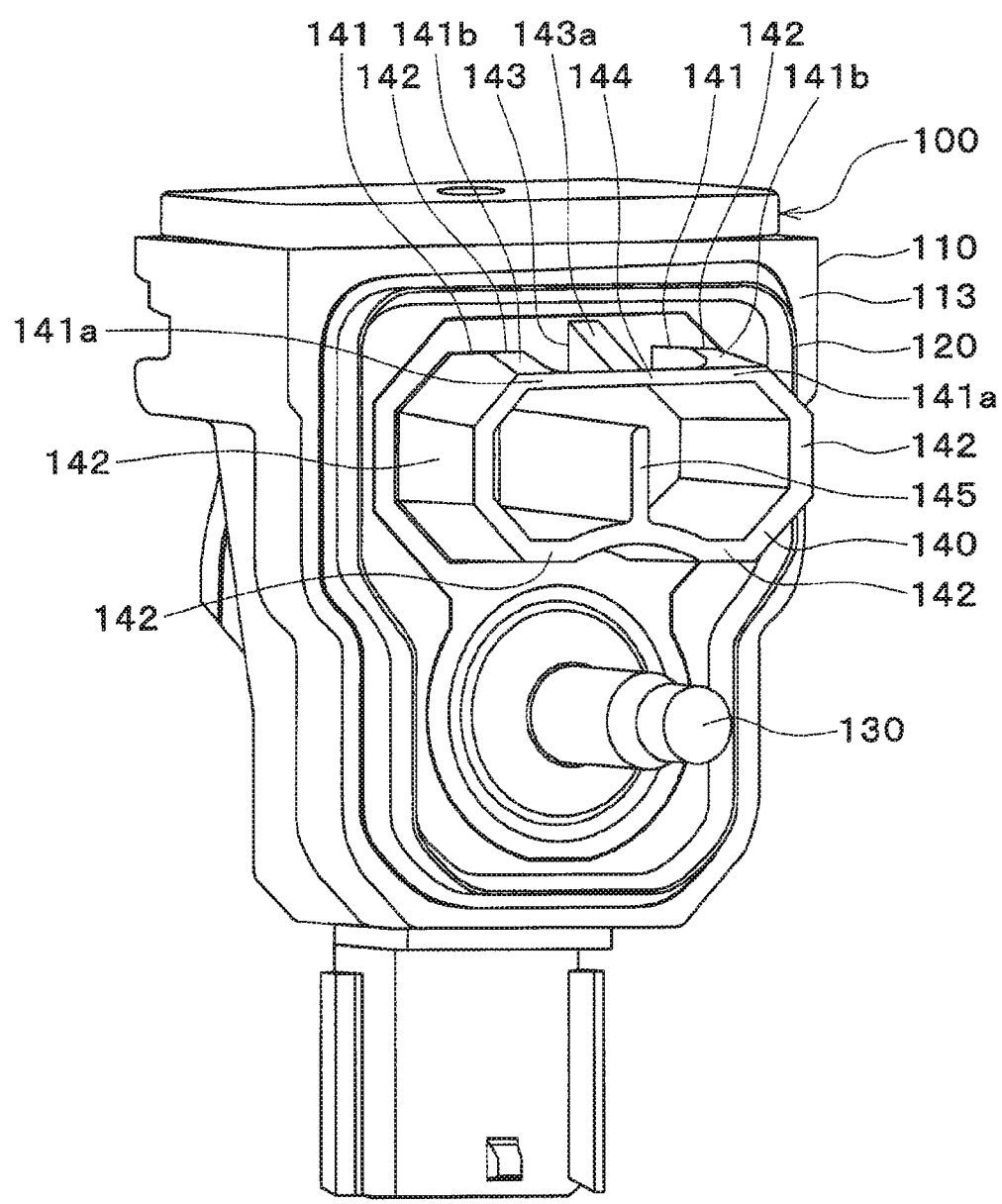
FIG. 2 is a perspective view of the pressure sensor shown in FIG. 1.

More specifically, as are shown in FIG. 1 and FIG. 2, the pressure sensor 100 includes a main body portion 110, an elastic portion 120, a screw portion 130, and a temporary fixing unit 140.

The main body portion 110 is formed so as to detect a variance in pressure of a pressure medium inside the door caused by a lateral collision to the vehicle door. Hence, the main body portion 110 has a pressure detection portion that is unillustrated and a side wall portion 113.

The pressure detection portion is formed so as to detect a pressure of the pressure medium inside the door when the pressure varies due to a lateral collision to the door.

The side wall portion 113 is a part of an outer wall surface of the main body portion 110 and the part is located oppositely to the door panel 200.

The elastic portion 120 is provided to the side wall portion 113 of the main body portion 110 so as to be in contact with a periphery of the aperture 210 of the door panel 200. The elastic portion 120 is provided to the side wall portion 113 in an annular shape surrounding the aperture 210, namely, the temporary fixing unit 140 and the screw portion 130. The elastic portion 120 is made of, for example, rubber or a soft material like rubber.

Figure 3:
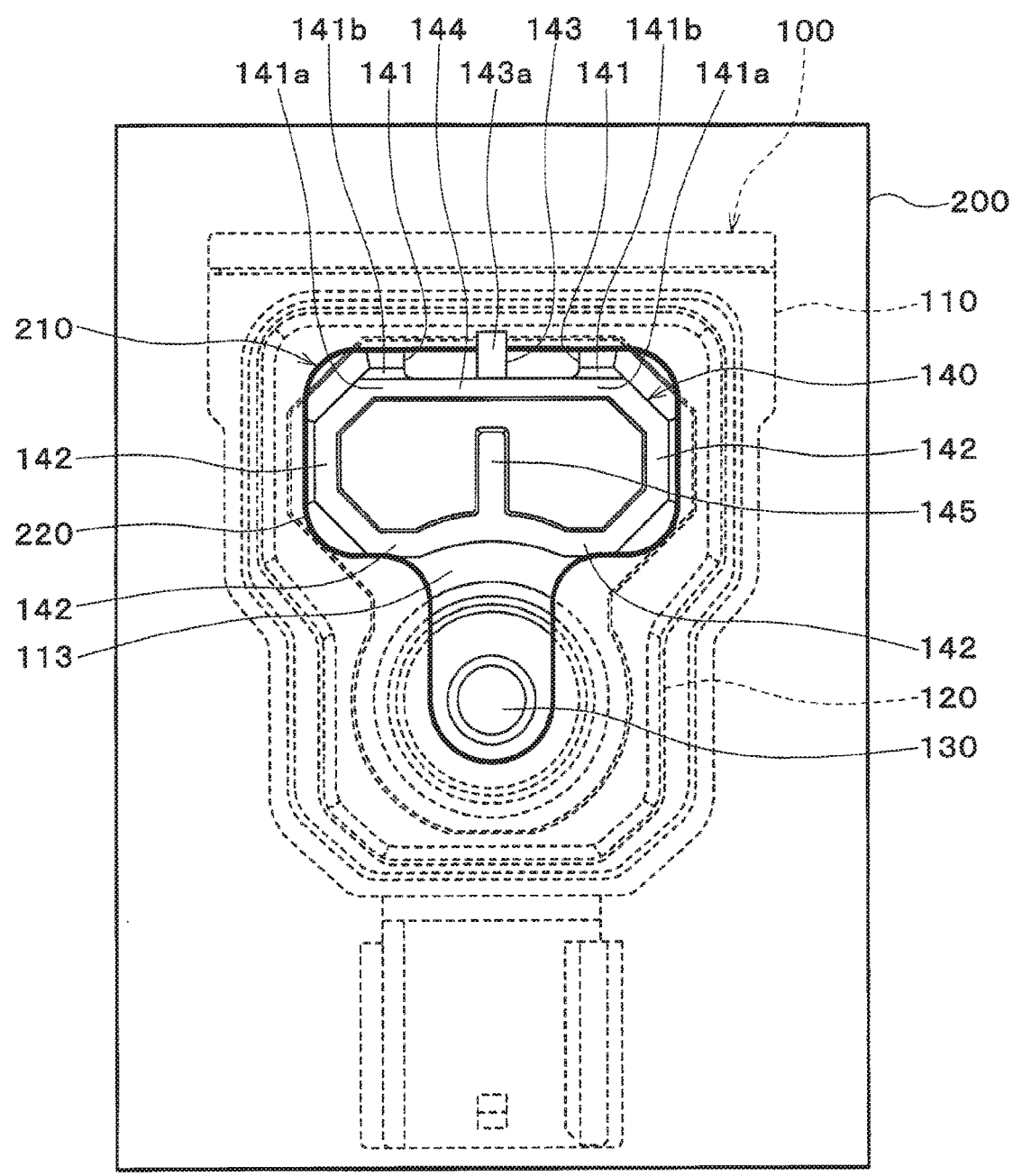
FIG. 3 is a top view when a temporary fixing unit is inserted in an aperture of an inner panel.

The screw portion 130 is provided to the main body portion 110 so as to protrude from the side wall portion 113. That is to say, the screw portion 130 includes a base portion and a bolt portion and the base portion is fixed to the main body portion 110. As are shown in FIG. 1 and FIG. 3, the screw portion 130 is set by passing the bolt portion through the aperture 210 and fastening the bolt portion to an unillustrated nut. Consequently, the main body portion 110 is screwed to the door panel 200.

As is shown in FIG. 3, the aperture 210 of the door panel 200 opens in a T-shape to let the temporary fixing unit 140 and the screw portion 130 of the pressure sensor 100 pass through. It should be appreciated, however, that an opening shape of the aperture 210 shown in FIG. 3 is a mere example and an opening corresponding to the temporary fixing unit 140 and an opening corresponding to the screw portion 130 may be provided separately.

The temporary fixing unit 140 is a portion provided to the side wall portion 113 so as to temporarily fix the main body portion 110 to the door panel 200. The temporary fixing unit 140 is a portion molded integrally with the main body portion 110 from resin. The temporary fixing unit 140 includes a portion to be passed through the aperture 210 and has a construction which allows the elastic portion 120 and the temporary fixing unit 140 to sandwich a part of the door panel 200 while the portion of the temporary fixing unit 140 is passed through the aperture 210. To be more specific, the temporary fixing unit 140 has a supporting portion 141, a rotation stopping portion 142, a holding portion 143, a spring portion 144, and a stopper portion 145.

The supporting portion 141 is a portion to support the spring portion 144. The supporting portion 141 is provided to the side wall portion 113 in a region enclosed by the elastic portion 120 so as to protrude from the side wall portion 113. In the present embodiment, two supporting portions 141 are provided. Each supporting portion 141 is formed with a distal end portion 141a to be passed through the aperture 210 of the door panel 200. The distal end portion 141a has a tapered surface 141b.

The tapered surface 141b slides along an edge portion 220 of the aperture 210 when the supporting portion 141 is passed through the aperture 210 of the door panel 200. Hence, the tapered surface 141b is provided in such a manner that an outer wall surface of the distal end portion 141a of the supporting portion 141 inclines toward a tip end of the distal end portion 141a. That is to say, the tapered surface 141b is provided to the distal end portion 141a of the supporting portion 141 in such a manner that the distal end portion 141a becomes smaller toward a center of an opening of the aperture 210.

Owing to the configuration as above, when the temporary fixing unit 140 is put into the aperture 210, the tapered surfaces 141b make contact with the edge portion 220 of the aperture 210 and slide along the edge portion 220. Hence, the supporting portions 141 are easily passed through the aperture 210. In particular, under circumstances where an operator is not able to visually confirm the aperture 210 of the door panel 200, the configuration as above enables the operator who is trying to put the temporary fixing unit 140 into the aperture 210 by feeling to easily succeed in putting the temporary fixing unit 140 into the aperture 210.

The rotation stopping portion 142 is a portion to inhibit the temporary a fixing unit 140 from rotating about an opening direction of the aperture 210 while the temporary fixing unit 140 is inserted in the aperture 210 of the door panel 200. In other words, the rotation stopping portion 142 inhibits the temporary fixing unit 140 from rotating about a shaft center parallel to the opening direction of the aperture 210. As is shown in FIG. 2, the rotation stopping portion 142 is provided to the side wall portion 113 of the main body portion 110 in a region enclosed by the elastic portion 120 so as to protrude from the side wall portion 113 like a wall.

The supporting portions 141 described above also function as the rotation stopping portion 142. That is to say, the supporting portions 141 and the rotation stopping portion 142 are integrally provided to the side wall portion 113. It should be appreciated, however, that the supporting portions 141 and the rotation stopping portion 142 may be provided separately.

Also, as is shown in FIG. 3, the rotation stopping portion 142 is provided along the edge portion 220 of the aperture 210. That is to say, the rotation stopping portion 142 is provided so as to conform to an opening shape of the aperture 210 with a purpose of making contact with the edge portion 220 when the temporary fixing unit 140 is close to rotating about the opening direction of the aperture 210. When configured in the manner as above, the main body portion 110 hardly rotates about the opening direction of the aperture 210 due to presence of the rotation stopping portion 142. Hence, wobbling of the main body portion 110 with respect to the door panel 200 can be restricted.

While the temporary fixing unit 140 is inserted in the aperture 210 of the door panel 200, the holding portion 143 temporarily fixes the main body portion 110 to the door panel 200 by sandwiching the door panel 200 between the holding portion 143 and the elastic portion 120. The holding portion 143 is a portion located oppositely to the side wall portion 113 of the main body portion 110 while the pressure sensor 100 is not fixed to the door panel 200. The holding portion 143 is so-called a snap-fit pin.

While the pressure sensor 100 is not fixed to the door panel 200, the holding portion 143 only has to be located oppositely to the main body portion 110. That is to say, the phrase, "the holding portion 143 is located oppositely to the main body portion 110", referred to herein means not only a case where the holding portion 143 is located oppositely to the side wall portion 113 but also a case where the holding portion 143 is located oppositely to the elastic portion 120. Naturally, the phrase also means a case where the holding portion 143 is located oppositely to both of the side wall portion 113 and the elastic portion 120.

The holding portion 143 has an inclined surface 143a. The inclined surface 143a of the holding portion 143 is a surface which slides along the edge portion 220 of the aperture 210 of the door panel 200 when the holding portion 143 is passed through the aperture 210. The inclined surface 143a of the holding portion 143 is provided to the holding portion 143 so as to incline in a same direction as the tapered surfaces 141b of the supporting portions 141. Conversely, each tapered surface 141b is provided to the distal end portion 141a of the supporting portion 141 so as to incline in a same direction as the inclined surface 143a. It is preferable that the tapered surfaces 141b and the inclined surface 143a incline at a same angle. The configuration as above makes it easier to pass the distal end portions 141a of the supporting portions 141 through the aperture 210 of the door panel 200.

The spring portion 144 connects the distal end portions 141a of the supporting portions 141 and the holding portion 143. The supporting portions 141 are integrally provided to the spring portion 144 at respective ends and the holding portion 143 is integrally provided at an intermediate portion. The spring portion 144 configured in the manner as above undergoes torsional deformation when the holding portion 143 is pushed down while the inclined surface 143a of the holding portion 143 slides along the edge portion 220 of the aperture 210 of the door panel 200.

In short, the spring portion 144 is rotatable about a longitudinal direction of the spring portion 144 as a rotation shaft. More specifically, when the holding portion 143 is pushed down by the edge portion 220 of the aperture 210, the spring portion 144 rotates in a direction in which the holding portion 143 is pushed down. On the other hand, once the holding portion 143 has passed through the aperture 210, the spring portion 144 rotates in a direction in which the holding portion 143 returns to its original position.

The stopper portion 145 prevents breaking of the spring portion 144. The stopper portion 145 is provided to the side wall portion 113 at a position opposite to the inclined surface 143a of the holding portion 143 and shaped like a wall. Also, the stopper portion 145 is provided to the side wall portion 113 to be spaced apart from the holding portion 143. A spacing distance between the holding portion 143 and the stopper portion 145 corresponds to a range within which the holding portion 143 is allowed to move.

Owing to the configuration as above, because the inclined surface 143a of the holding portion 143 slides along the edge portion 220 of the aperture 210, movement of the holding portion 143 when the holding portion 143 is pushed down is restricted by the stopper portion 145. Hence, the holding portion 143 can be prevented from undergoing displacement over a predetermined movable amount. That is to say, the spring portion 144 can be prevented from being twisted excessively. Breaking of the holding portion 143 and the spring portion 144 can be thus prevented.

In the present embodiment, the stopper portion 145 is provided integrally with the rotation stopping portion 142. It should be appreciated, however, that the stopper portion 145 may be provided separately from the rotation stopping portion 142. The above has described an overall configuration of the pressure sensor 100 of the present embodiment.

A method of temporarily fixing the pressure sensor 100 to the door panel 200 will now be described. Firstly, the pressure sensor 100 configured as above is prepared and the temporary fixing unit 140 is put into the aperture 210 of the door panel 200. The tapered surfaces 141b of the supporting portions 141 thus slide along the edge portion 220 of the aperture 210. Subsequently, the inclined surface 143a of the holding portion 143 slides along the edge portion 220 of the aperture 210 and is also pushed down by the edge portion 220.

Once the entire holding portion 143 has passed through the aperture 210, the holding portion 143 returns to the original position due to a restoring farce of the spring portion 144. By passing the holding portion 143 through the aperture 210 in the manner as above, a part of the door panel 200 is sandwiched between the holding portion 143 and the elastic portion 120. Further, the elastic portion 120 is forced to undergo elastic deformation while pressing against the door panel 200. In the manner as above, the main body portion 110 of the pressure sensor 100 is temporarily fixed to the door panel 200.

Subsequently, the pressure sensor 100 is fixed to the door panel 200 by fastening the bolt portion of the screw portion 130 with a nut.

Figure 4:
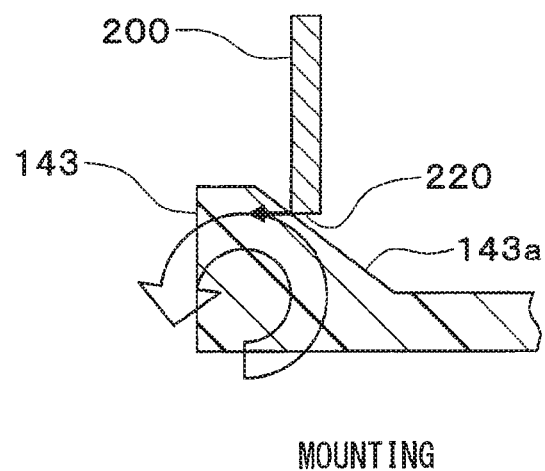
FIG. 4 is a view showing a motion of a holding portion with respect to a door panel in a temporarily-fixed state.
Figure 5:
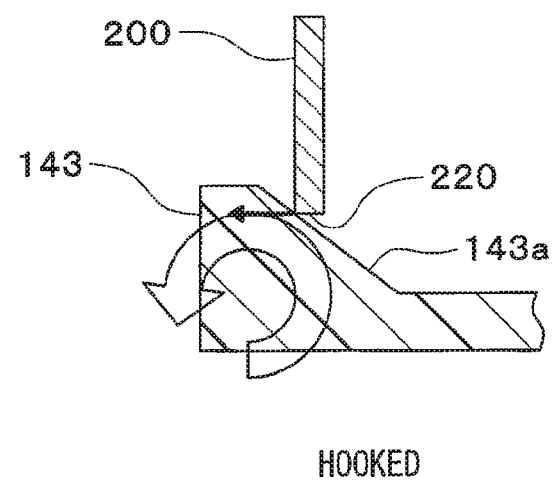
FIG. 5 is a view showing a motion of the holding portion when the holding portion is hooked into the door panel.

As has been described above, the pressure sensor 100 of the present embodiment has a construction in which the spring portion 144 is positioned on an opposite side of the door panel 200 to the main body portion 110. Owing to the construction as above, when the holding portion 143 is pushed down by the edge portion 220 of the aperture 210, as is shown in FIG. 4, the spring portion 144 is merely twisted along the pushed down direction. Even when the holding portion 143 is hooked into the aperture 210, as is shown in FIG. 5, only torsion occurs in the spring portion 144 and no stress is applied to the holding portion 143. Hence, breaking of the temporary fixing unit 140 can be prevented.

Further, because the elastic portion 120 is forced to undergo elastic deformation while pressing against the door panel 200, adhesion of the elastic portion 120 to the door panel 200 can be enhanced. That is to say, a clearance between the main body portion 110 and the door panel 200 can be smaller. Consequently, the main body portion 110 can be temporarily fixed to the door panel 200 while preventing the main body portion 110 from wobbling with respect to the door panel 200.

In the present embodiment, the door panel 200 is a mounting target.

Other Embodiments

The configuration of the pressure sensor 100 described in the embodiment above is a mere example. It should be understood that the present disclosure is not limited to the configuration described above and any other configuration realizing the present disclosure is adoptable as well. For example, shapes of the supporting portions 141, the rotation stopping portion 142, the holding portion 143, the spring portion 144, and the stopper portion 145 as components forming the temporary fixing unit 140 are not limited to the shapes described above and the respective portions can be of any other shape as long as each portion is capable of realizing its function. For example, while the pressure sensor 100 is not fixed to the door panel 200, the holding portion 143 may be located oppositely to the elastic portion 120 provided to the side wall portion 113 of the main body portion 110.

The temporary fixing unit 140 may not be provided with the rotation stopping portion 142, tapered surfaces 141*b* of distal end portions 141*a* of supporting portions 141, and the stopper portion 145. Further, tapered surfaces 141*b* of distal end portions 141*a* of supporting portions 141 are not necessarily inclined in a same direction as the inclined surface 143*a* of the holding portion 143.

The main body portion 110 may not have a screw portion. For example, the configuration may be modified in such a manner that the main body portion 110 is provided with a through-hole through which to pass a bolt. According to the modified configuration, by passing a bolt through the main body portion 110 while the main body portion 110 is temporarily fixed to the door panel 200 and by fastening the bolt with a nut, the main body portion 110 can be fixed to the door panel 200.

The embodiment above has described a case where the pressure sensor is the mounting structure. It should be appreciated, however, that the described case is a mere example. Hence, the mounting structure can be any other structure. Further, the mounting structure is not limited to a member equipped to a vehicle.

While the present disclosure has been described with reference to the embodiments thereof, it is to be understood that the disclosure is not limited to the embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

The invention claimed is:

1. A mounting structure formed to be temporarily fixable to a mounting target having an aperture formed therein, wherein the mounting structure comprises:
    a main body portion having a side wall portion;
    an elastic portion provided on the side wall portion, wherein the elastic portion is configured to contact the mounting target and to surround the aperture; and
    a temporary fixing unit including a portion to be passed through the aperture and provided on the side wall portion to temporarily fix the main body portion to the mounting target by sandwiching a part of the mounting target between the temporary fixing unit and the elastic portion while the portion of the temporary fixing unit is passed through the aperture, wherein
    the temporary fixing unit has,
        a supporting portion provided on the side wall portion and including a distal end portion to be passed through the aperture,
        a holding portion located oppositely to the main body portion and provided with an inclined surface, which slides along an edge portion of the aperture when the holding portion is passed through the aperture,
        a spring portion connecting the distal end portion of the supporting portion and the holding portion, wherein the spring portion undergoes deformation when the holding portion is pushed down while the inclined surface of the holding portion slides along the edge portion of the aperture, and
        a stopper portion, which is a single planar member and which extends from the side wall portion toward the holding portion,
    the stopper portion is configured to limit movement of the holding portion when the holding portion is pushed down while the inclined surface of the holding portion slides along the edge portion of the aperture,
    the supporting portion is separated from the stopper portion,
    the main body portion is temporarily fixed to the mounting target when, by passing the holding portion through the aperture, the part of the mounting target is sandwiched between the holding portion and the elastic portion and further the elastic portion is forced to undergo elastic deformation while pressing against the mounting target,
    the holding portion has a surface that faces the main body portion and is configured to make surface contact with a part of the mounting target that is located outward of the aperture after the holding portion is passed through the aperture,
    the supporting portion is one of two supporting portions that are integral with the spring portion, and the supporting portions are located at opposite ends of the spring portion, respectively, and
    the holding portion is located at an intermediate position between the supporting portions.

2. The mounting structure according to claim 1, wherein the temporary fixing unit has a rotation stopping portion provided on the side wall portion and inhibiting a rotation about the aperture by making contact with the edge portion of the aperture.

3. The mounting structure according to claim 1, wherein the distal end portion of each of the supporting portions has a tapered surface, which slides along the edge portion of the aperture when the distal end portion is passed through the aperture.

4. The mounting structure according to claim 3, wherein each tapered surface is provided on the distal end portion to incline in a same direction as the inclined surface.

5. The mounting structure according to claim 1, wherein the main body portion has a screw portion provided on the side wall portion to be passed through the aperture and screwed to the mounting target.

6. A mounting structure formed to be temporarily fixable to a mounting target having an aperture formed therein, wherein the mounting structure comprises:
    a main body portion having a side wall portion;
    an elastic portion provided on the side wall portion, wherein the elastic portion is configured to contact the mounting target and to surround the aperture; and
    a temporary fixing unit including a portion to be passed through the aperture and provided on the side wall portion to temporarily fix the main body portion to the mounting target by sandwiching a part of the mounting target between the temporary fixing unit and the elastic portion while the portion of the temporary fixing unit is passed through the aperture, wherein
    the temporary fixing unit has,
        a supporting portion provided on the side wall portion and including a distal end portion to be passed through the aperture,
        a holding portion located oppositely to the main body portion and provided with an inclined surface, which slides along an edge portion of the aperture when the holding portion is passed through the aperture,
        a spring portion connecting the distal end portion of the supporting portion and the holding portion, wherein the spring portion undergoes deformation when the holding portion is pushed down while the inclined surface of the holding portion slides along the edge portion of the aperture, and a stopper portion, which is a single planar member and which extends from the side wall portion toward the holding portion, the supporting portion is separated from the stopper portion, the stopper portion is configured to limit movement of the holding portion when the holding portion is pushed down while the inclined surface of the holding portion slides along the edge portion of the aperture, the stopper portion includes flat surfaces, one of the flat surfaces is perpendicular to the side wall portion, another of the flat surfaces is parallel to the side wall portion, the main body portion is temporarily fixed to the mounting target when, by passing the holding portion through the aperture, the part of the mounting target is sandwiched between the holding portion and the elastic portion and further the elastic portion is forced to undergo elastic deformation while pressing against the mounting target, the holding portion has a surface that faces the main body portion and is configured to make surface contact with a part of the mounting target that is located outward of the aperture after the holding portion is passed through the aperture, wherein the supporting portion is one of two supporting portions that are integral with the spring portion, and the supporting portions are located at opposite ends of the spring portion, respectively, and the holding portion is located at an intermediate position between the supporting portions.

7. The mounting structure according to claim 6, wherein the temporary fixing unit has a rotation stopping portion provided on the side wall portion and inhibiting a rotation about the aperture by making contact with the edge portion of the aperture.

8. The mounting structure according to claim 6, wherein the distal end portion of each of the supporting portions has a tapered surface, which slides along the edge portion of the aperture when the distal end portion is passed through the aperture.

9. The mounting structure according to claim 8, wherein the tapered surface is provided on the distal end portion to incline in a same direction as the inclined surface.

10. The mounting structure according to claim 6, wherein the main body portion has a screw portion provided on the side wall portion to be passed through the aperture and screwed to the mounting target.

11. The mounting structure according to claim 1, wherein the spring portion lies directly between the holding portion and the stopper portion.

12. The mounting structure according to claim 6, wherein the spring portion lies directly between the holding portion and the stopper portion.

13. The mounting structure according to claim 1, wherein each supporting portion includes a tapered surface, and each tapered surface is inclined in a direction of inclination of the inclined surface.

14. The mounting structure according to claim 6, wherein each supporting portion includes a tapered surface, and each tapered surface is inclined in a direction of inclination of the inclined surface.

15. The mounting structure according to claim 1, wherein the spring portion undergoes torsional rotation when the inclined surface slides along an edge surface of the aperture.

16. The mounting structure according to claim 6, wherein the spring portion undergoes torsional rotation when the inclined surface slides along an edge surface of the aperture.

* * * * *